(12) United States Patent
Yin et al.

(10) Patent No.: US 12,740,120 B2
(45) Date of Patent: Sep. 15, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Li-Wei Yin, Hsinchu (TW); Tzu-Wen Pan, Hsinchu (TW); Yu-Hsien Lin, Kaohsiung (TW); Yu-Shih Wang, Tainan (TW); Jih-Sheng Yang, Hsinchu (TW); Shih-Chieh Chao, Taichung (TW); Yih-Ann Lin, Hsinchu (TW); Ryan Chia-Jen Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 617 days.

(21) Appl. No.: 18/153,571

(22) Filed: Jan. 12, 2023

(65) Prior Publication Data

US 2024/0096630 A1 Mar. 21, 2024

Related U.S. Application Data

(60) Provisional application No. 63/375,975, filed on Sep. 16, 2022.

(51) Int. Cl.
*H10D 64/01* (2025.01)
*H10D 30/01* (2025.01)
(Continued)

(52) U.S. Cl.
CPC ..... *H10D 64/01326* (2026.01); *H10D 30/024* (2025.01); *H10D 30/6211* (2025.01);
(Continued)

(58) Field of Classification Search
CPC ................ H10D 64/518; H10D 64/017; H01L 21/76834
See application file for complete search history.

(56) References Cited

U.S. PATENT DOCUMENTS

| | | | | |
|---|---|---|---|---|
| 9,865,697 | B1 * | 1/2018 | Hsueh | H10D 64/015 |
| 11,658,064 | B2 | 5/2023 | Wang et al. | |

(Continued)

FOREIGN PATENT DOCUMENTS

| | | | |
|---|---|---|---|
| TW | 202213465 | A | 4/2022 |
| TW | 202213539 | A | 4/2022 |

*Primary Examiner* — Alia Sabur
(74) *Attorney, Agent, or Firm* — Ingrassia Fisher & Lorenz, LLP | IF&L

(57) ABSTRACT

Disclosed is a semiconductor fabrication method. The method includes forming a gate stack in an area previously occupied by a dummy gate structure; forming a first metal cap layer over the gate stack; forming a first dielectric cap layer over the first metal cap layer; selectively removing a portion of the gate stack and the first metal cap layer while leaving a sidewall portion of the first metal cap layer that extends along a sidewall of the first dielectric cap layer; forming a second metal cap layer over the gate stack and the first metal cap layer wherein a sidewall portion of the second metal cap layer extends further along a sidewall of the first dielectric cap layer; forming a second dielectric cap layer over the second metal cap layer; and flattening a top layer of the first dielectric cap layer and the second dielectric cap layer using planarization operations.

20 Claims, 16 Drawing Sheets

(51) Int. Cl.
*H10D 30/62* (2025.01)
*H10D 64/66* (2025.01)

(52) U.S. Cl.
CPC ... *H10D 64/0112* (2026.01); *H10D 64/01318* (2026.01); *H10D 64/017* (2025.01); *H10D 64/671* (2025.01)

(56) References Cited

U.S. PATENT DOCUMENTS

| | | | | |
|---|---|---|---|---|
| 11,705,491 | B2 | 7/2023 | Hsiung et al. | |
| 2016/0104644 | A1* | 4/2016 | Liu | H10D 84/038 257/401 |
| 2017/0077257 | A1* | 3/2017 | Hung | H10D 64/518 |
| 2017/0317079 | A1* | 11/2017 | Kim | H10D 84/834 |
| 2018/0331219 | A1* | 11/2018 | Liou | H10D 64/015 |
| 2019/0371913 | A1* | 12/2019 | Miao | H10D 64/667 |
| 2020/0058748 | A1* | 2/2020 | Bae | H10D 64/015 |
| 2021/0134671 | A1* | 5/2021 | Xie | H01L 21/76834 |
| 2023/0010065 | A1* | 1/2023 | Chiu | H10D 62/343 |

* cited by examiner 500
526
524
508
520
506
528
502
504
522
512
514
501

SEMICONDUCTOR DEVICE AND MANUFACTURING METHOD THEREOF

CROSS-REFERENCE TO RELATED APPLICATION

This application claims the benefit of U.S. Provisional Application No. 63/375,975, filed Sep. 16, 2022.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum feature sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
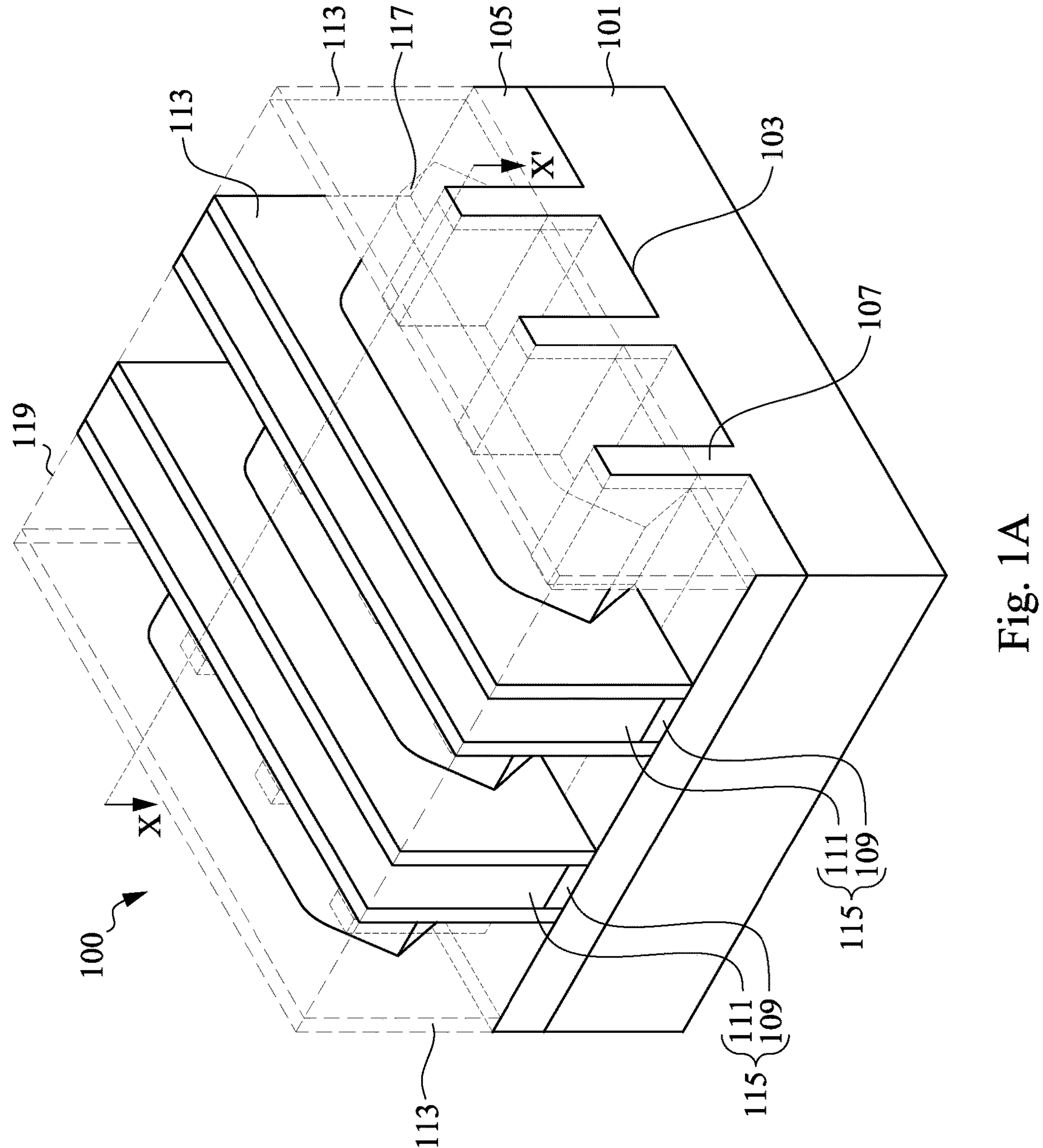
FIG. 1A a perspective view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as “over”, “overlying”, “above”, “upper”, “top”, “under”, “underlying”, “below”, “lower”, “bottom”, and the like, may be used herein for ease of description to describe one element’s or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being “on” another element or layer, it is directly on and in contact with the other element or layer.

In addition, the present disclosure may repeat reference numerals and/or letters in the various examples. This repetition is for the purpose of simplicity and clarity and does not in itself dictate a relationship between the various embodiments and/or configurations discussed.

It is noted that references in the specification to “one embodiment,” “an embodiment,” “an example embodiment,” “exemplary,” “example,” etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to affect such feature, structure, or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Various embodiments are discussed herein in a particular context, namely, for forming a semiconductor structure that includes a fin-like field-effect transistor (FinFET) device. The semiconductor structure, for example, may be a complementary metal-oxide-semiconductor (CMOS) device including a P-type metal-oxide-semiconductor (PMOS) FinFET device and an N-type metal-oxide-semiconductor (NMOS) FinFET device.

Embodiments will now be described with respect to particular examples including FinFET manufacturing processes. Embodiments, however, are not limited to the examples provided herein, and the ideas may be implemented in a wide array of embodiments. Thus, various embodiments may be applied to other semiconductor devices/processes, such as planar transistors, and the like. Further, some embodiments discussed herein are discussed in the context of devices formed using a gate-last process. In other embodiments, a gate-first process may be used.

While the figures illustrate various embodiments of a semiconductor device, additional features may be added in the semiconductor device depicted in the Figures and some of the features described below can be replaced, modified, or eliminated in other embodiments of the semiconductor device.

Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1B:
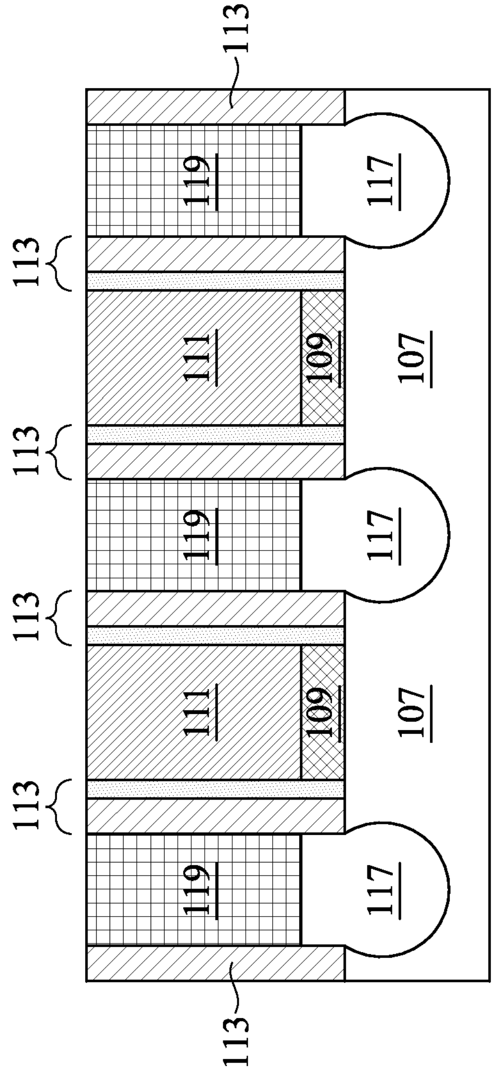
FIG. 1B illustrates a cross-sectional view of FIG. 1A along cutline X-X', in accordance with some embodiments.

With reference now to FIG. 1A, there is illustrated a perspective view of a semiconductor device 100 such as a FinFET device. FIG. 1B illustrates a cross-sectional view of FIG. 1A along cutline X-X', according to some embodiments. In an embodiment the semiconductor device 100 comprises a substrate 101 and first trenches 103. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

In other embodiments the substrate 101 may be chosen to be a material which will specifically boost the performance (e.g., boost the carrier mobility) of the devices formed from the substrate 101. For example, in some embodiments the material of the substrate 101 may be chosen to be a layer of epitaxially grown semiconductor material, such as epitaxially grown silicon germanium which helps to boost some of the measurements of performance of devices formed from the epitaxially grown silicon germanium. However, while the use of these materials may be able to boost some of the performance characteristics of the devices, the use of these same materials may affect other performance characteristics of the device. For example, the use of epitaxially grown silicon germanium may degrade (with respect to silicon) the interfacial defects of the device.

The first trenches 103 may be formed as an initial step in the eventual formation of first isolation regions 105. The first trenches 103 may be formed using a masking layer (not separately illustrated in FIG. 1A) along with a suitable etching process. For example, the masking layer may be a hard mask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching processes additionally form fins 107 from those portions of the substrate 101 that remain unremoved. These fins 107 may be used to form the channel region of multiple-gate FinFET transistors. While FIG. 1A only illustrates three of the fins 107 formed from the substrate 101, any number of fins 107 may be utilized.

Furthermore, the fins 107 may be patterned by any suitable method. For example, the fins 107 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 107.

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, dummy gate dielectrics 109, dummy gate electrodes 111 over the dummy gate dielectrics 109, and spacers 113 may be formed over each of the fins 107. In an embodiment the dummy gate dielectrics 109 may be formed by thermal oxidation, chemical vapor deposition, sputtering, or any other methods known and used in the art for forming a gate dielectric. Depending on the technique of gate dielectric formation, the dummy gate dielectrics 109 thickness on the top of the fins 107 may be different from the gate dielectric thickness on the sidewall of the fins 107.

The dummy gate dielectrics 109 may comprise a material such as silicon dioxide or silicon oxynitride. The dummy gate dielectrics 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof. Additionally, any combination of silicon dioxide, silicon oxynitride, and/or high-k materials may also be used for the dummy gate dielectrics 109.

The dummy gate electrodes 111 may comprise a conductive or non-conductive material and may be selected from a group comprising polysilicon, W, Al, Cu, AlCu, W, Ti, TiAlN, TaC, TaCN, TaSiN, Mn, Zr, TiN, Ta, TaN, Co, Ni, combinations of these, or the like. The dummy gate electrodes 111 may be deposited by chemical vapor deposition (CVD), sputter deposition, or other techniques known and used in the art for depositing conductive materials. The top surface of the dummy gate electrodes 111 may have a non-planar top surface, and may be planarized prior to patterning of the dummy gate electrodes 111 or gate etch. Ions may or may not be introduced into the dummy gate electrodes 111 at this point. Ions may be introduced, for example, by ion implantation techniques.

Once formed, the dummy gate dielectrics 109 and the dummy gate electrodes 111 may be patterned to form a series of dummy stacks 115 over the fins 107. The dummy stacks 115 define multiple channel regions located on each side of the fins 107 beneath the dummy gate dielectrics 109. The dummy stacks 115 may be formed by depositing and patterning a gate mask (not separately illustrated in FIG. 1A) on the dummy gate electrodes 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride. The dummy gate electrodes 111 and the dummy gate dielectrics 109 may be etched using a dry etching process to form the patterned in the dummy stacks 115.

Once the dummy stacks 115 have been patterned, the spacers 113 may be formed. The spacers 113 may be formed on opposing sides of the dummy stacks 115. The spacers 113 may be formed by blanket depositing one (as illustrated in FIG. 1A for clarity) or more (as illustrated in FIG. 1B) spacer layers on the previously formed structure. The one or more spacer layers may comprise SiN, oxynitride, SiC, SiON, SiOCN, SiOC, oxide, and the like and may be formed by methods utilized to form such layers, such as chemical vapor deposition (CVD), plasma enhanced CVD, sputter, and other methods known in the art. In embodiments with more than one spacer layer, the one or more spacer layers may be formed in similar manners using similar materials, but different from one another, such as by comprising materials having different component percentages and with different curing temperatures and porosities. Furthermore, the one or more spacer layers may comprise a different material with different etch characteristics or the same material as the dielectric material within the first isolation regions 105. The one or more spacer layers may then be patterned, such as by one or more etches to remove the one or more spacer layers from the horizontal surfaces of the structure. As such, the one or more spacer layers are formed along sidewalls of the dummy stacks 115 and are collectively referred to as the spacers 113.

FIG. 1A further illustrates a removal of the fins 107 (although the location of the fins 107 is still illustrated in FIG. 1A to show where they were originally located) from those areas not protected by the dummy stacks 115 and the spacers 113 and a regrowth of source/drain regions 117. Source/drain region(s) may refer to a source or a drain, individually or collectively dependent upon the context. The removal of the fins 107 from those areas not protected by the dummy stacks 115 and the spacers 113 may be performed by a reactive ion etch (RIE) using the dummy stacks 115 and the spacers 113 as hard masks, or by any other suitable removal process. The removal may be continued until the fins 107 are either planar with (as illustrated) or below the surface of the first isolation regions 105.

Once these portions of the fins 107 have been removed, a hard mask (not separately illustrated), is placed and patterned to cover the dummy gate electrodes 111 to prevent growth and the source/drain regions 117 may be regrown in contact with each of the fins 107. In an embodiment the source/drain regions 117 may be regrown and, in some embodiments the source/drain regions 117 may be regrown to form a stressor that will impart a stress to the channel regions of the fins 107 located underneath the dummy stacks 115. In an embodiment wherein the fins 107 comprise silicon and the FinFET is a p-type device, the source/drain regions 117 may be regrown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes.

Once the source/drain regions 117 are formed, dopants may be implanted into the source/drain regions 117 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the dummy stacks 115 and the spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present embodiments to the steps presented above.

Additionally, at this point the hard mask that covered the dummy gate electrodes 111 during the formation of the source/drain regions 117 is removed. In an embodiment the hard mask may be removed using, e.g., a wet or dry etching process that is selective to the material of the hard mask. However, any suitable removal process may be utilized.

FIG. 1A also illustrates a formation of a first interlayer dielectric (ILD) layer 119 (illustrated in dashed lines in FIG. 1A in order to illustrate more clearly the underlying structures) over the dummy stacks 115 and the source/drain regions 117. The first ILD layer 119 may comprise a material such as boron phosphorous silicate glass (BPSG), although any suitable dielectrics may be used. The first ILD layer 119 may be formed using a process such as PECVD, although other processes, such as LPCVD, may alternatively be used. Once formed, the first ILD layer 119 may be planarized with the spacers 113 using, e.g., a planarization process such as chemical mechanical polishing process, although any suitable process may be utilized.

Figure 2:
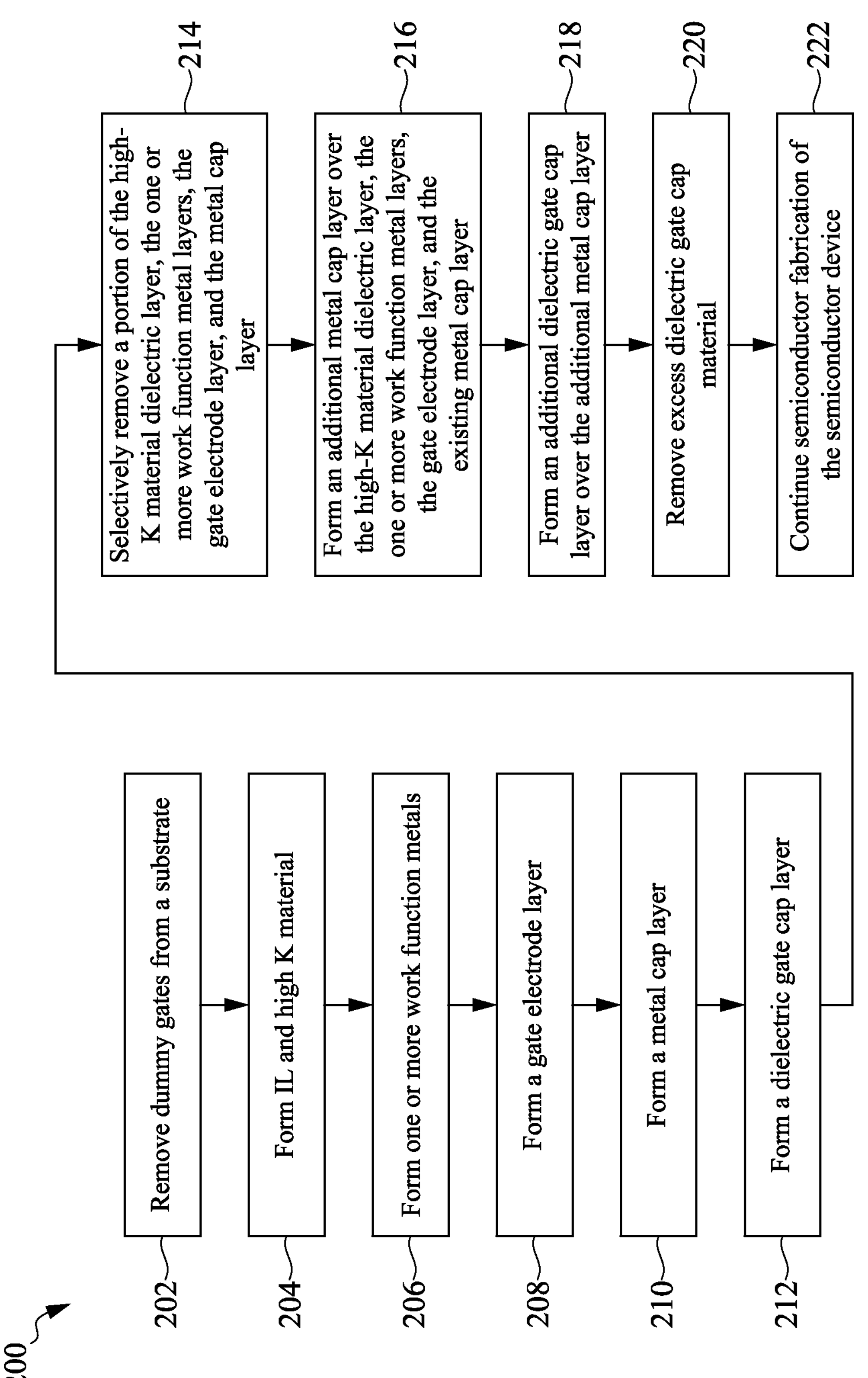
FIG. 2 is a process flow chart depicting an example fabrication process for forming, in a semiconductor device, metal gates that include a gate stack, a metal cap disposed above the gate stack, and a dielectric layer (such as silicon nitride (SiN)) disposed above the metal cap, in accordance with some embodiments.

FIG. 2 is a process flow chart depicting an example process 200 for forming, in a semiconductor device, metal gates that include a gate stack, a metal cap disposed above the gate stack, and a dielectric layer (such as silicon nitride (SiN)) disposed above the metal cap. FIG. 2 is described in conjunction with FIGS. 3A-3K, which are cross-sectional views of a semiconductor device, which illustrate the semiconductor device at various stages of fabrication in accordance with some embodiments of the present disclosure of the example process 200. The process 200 is merely an example, and is not intended to limit the present disclosure beyond what is explicitly recited in the claims. Additional steps may be provided before, during, and after example process 200, and some of the steps described can be moved, replaced, or eliminated for additional embodiments of example process 200. Additional features may be added in the semiconductor device depicted in the figures and some of the features described below can be replaced, modified, or eliminated in other embodiments of the semiconductor device.

It is understood that parts of the semiconductor device may be fabricated by typical semiconductor technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, and/or other logic devices, etc., but is simplified for a better understanding of concepts of the present disclosure. In some embodiments, the exemplary devices include a plurality of semiconductor devices (e.g., transistors), including PFETs, NFETs, etc., which may be interconnected. Moreover, it is noted that the operations of process 200, including any descriptions given with reference to the Figures are merely exemplary and are not intended to be limiting beyond what is specifically recited in the claims that follow.

FIGS. 3A-3K are diagrams depicting enlarged views of an example area 300 (and of sub-area 301 of example area 300) at various stages of fabricating a semiconductor device, in accordance with some embodiments. In some figures, some reference numbers of components or features illustrated therein may be omitted to avoid obscuring other components or features; this is for ease of depicting the figures.

At block 202, the example process 200 includes removing dummy gates from a substrate. The dummy gate electrode and/or gate dielectric may be removed by suitable etching processes. Referring to the example of FIGS. 3A and 3B, in an embodiment of block 202, the example area 300 and sub-area 301, includes a substrate 302 with openings 304 formed by the removal of dummy gates. In some embodiments, the substrate 302 may be a semiconductor substrate such as a silicon substrate. The substrate 302 may include various layers, including conductive or insulating layers formed on a semiconductor substrate. The substrate 302 may include various doping configurations depending on design requirements as is known in the art. For example, different doping profiles (e.g., n wells, p wells) may be formed on the substrate 302 in regions designed for different device types (e.g., n-type field effect transistors (NFET), p-type field effect transistors (PFET)). The suitable doping may include ion implantation of dopants and/or diffusion processes. The substrate 302 typically has isolation features (e.g., shallow trench isolation (STI) features) interposing the regions providing different device types. The substrate 302 may also include other semiconductors such as germanium, silicon carbide (SiC), silicon germanium (SiGe), or diamond. Alternatively, the substrate 302 may include a compound semiconductor and/or an alloy semiconductor. Further, the substrate 302 may optionally include an epitaxial layer (epi-layer), may be strained for performance enhancement, may include a silicon-on-insulator (SOI) structure, and/or have other suitable enhancement features.

The sub-area 301 further includes one or more spacer layers 306. In this example the one or more spacer layers 306 include a first spacer layer 306*a* (such as an etch stop layer), a second spacer layer 306*b*, and a third spacer layer 306*c*. The one or more spacer layers may comprise $SiO_2$, SiN, SiOC, oxynitride, SiC, SiON, SiOCN, oxide, and the like and may be formed by methods utilized to form such layers, such as chemical vapor deposition (CVD), plasma enhanced CVD, sputter, and other methods known in the art.

The sub-area 301 further includes an interlayer dielectric (ILDO) layer 308 over source/drain regions 310 and a second dielectric layer 312 above the ILDO layer 308. The ILDO layer 308 may comprise an oxide or a material such as boron phosphorous silicate glass (BPSG), although any suitable dielectrics may be used. The second dielectric layer 312 may comprise a material such as SiN or SiOCN, although any suitable dielectrics may be used. The ILDO layer 308 and/or the second dielectric layer 312 may be formed using a process such as PECVD, although other processes, such as LPCVD, may alternatively be used.

At block 204, the example process 200 includes forming an interfacial layer (IL) in the opening 304 over the substrate 302 and a high-K material dielectric layer over the IL. The interfacial layer may be formed by chemical oxidation, thermal oxidation, atomic layer deposition (ALD), chemical vapor deposition (CVD), and/or other suitable method. The high-K gate dielectric layer may be formed by ALD, physical vapor deposition (PVD), CVD, oxidation, and/or other suitable methods.

At block 206, the example process 200 includes forming one or more work function metals. The one or more work function metal layers may be formed by CVD, ALD and/or other suitable processes.

Figure 3A:
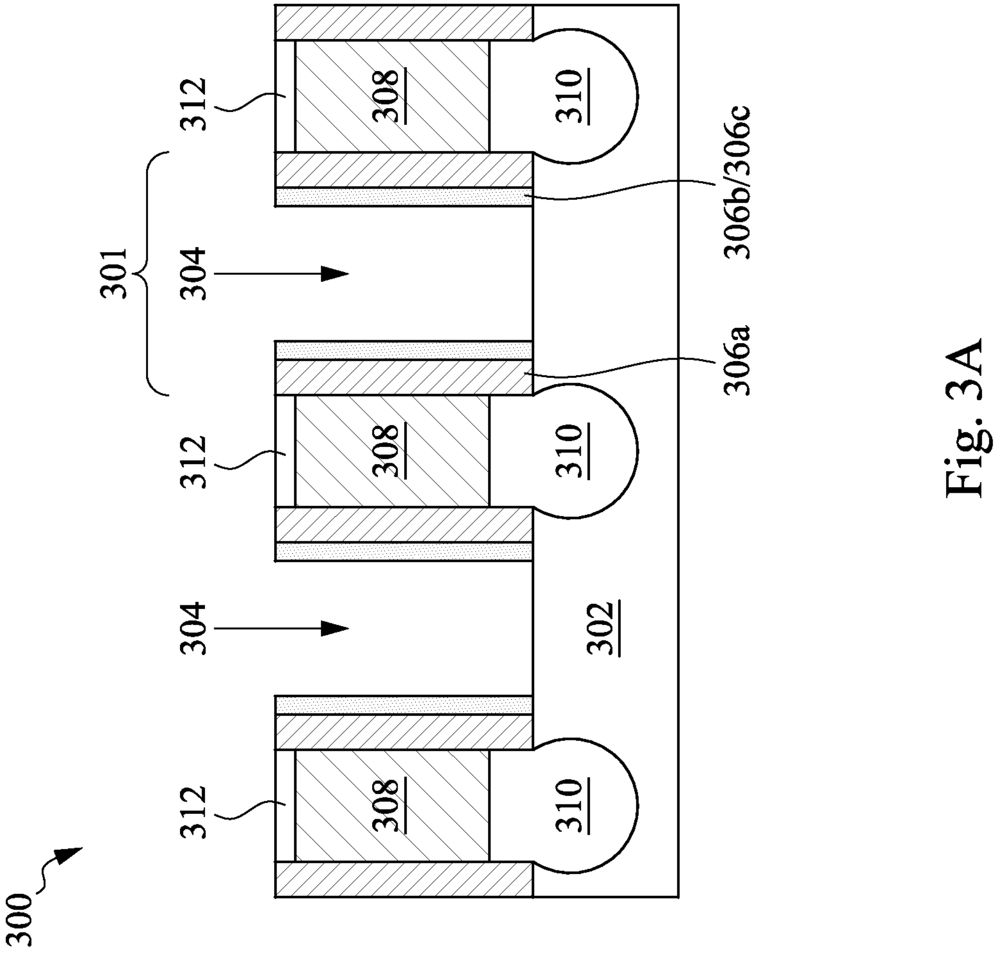
FIGS. 3A-3K are diagrams depicting enlarged views of an example area at various stages of fabricating a semiconductor device, in accordance with some embodiments.
Figure 3B:
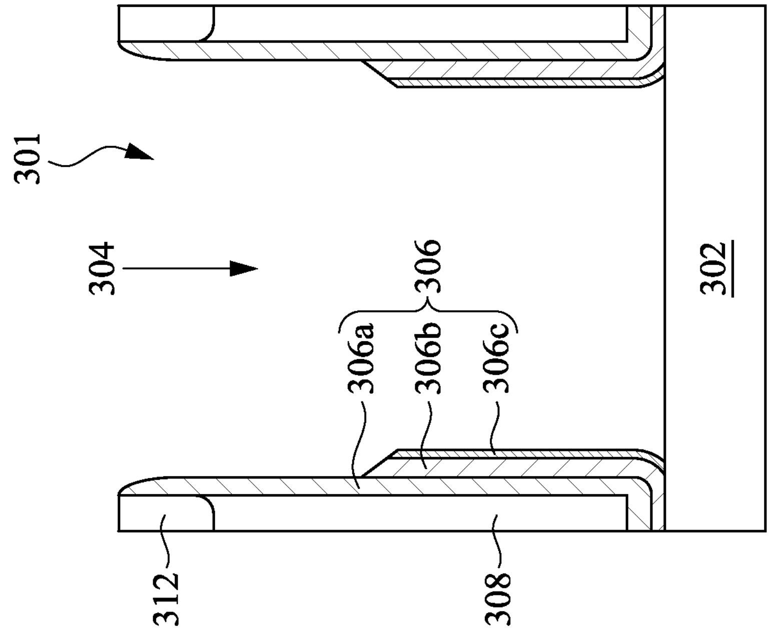
Figure 3D:
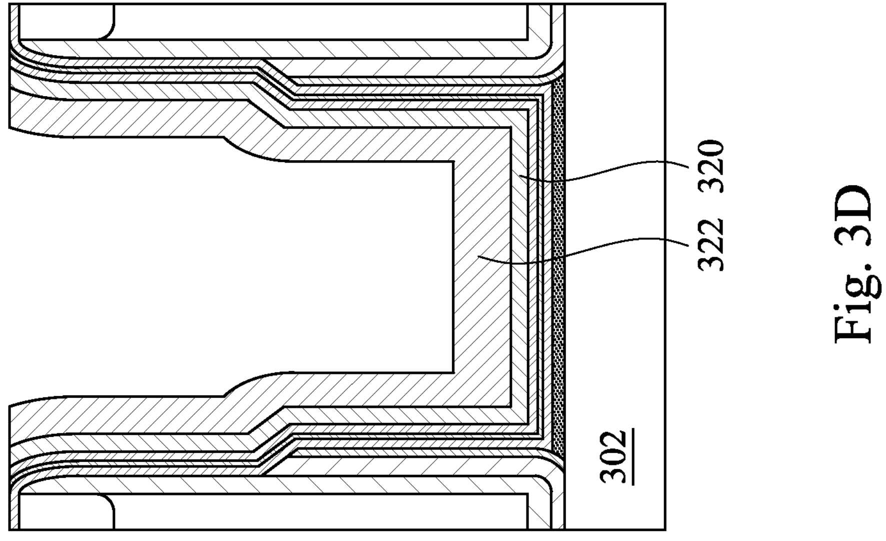
Figure 3C:
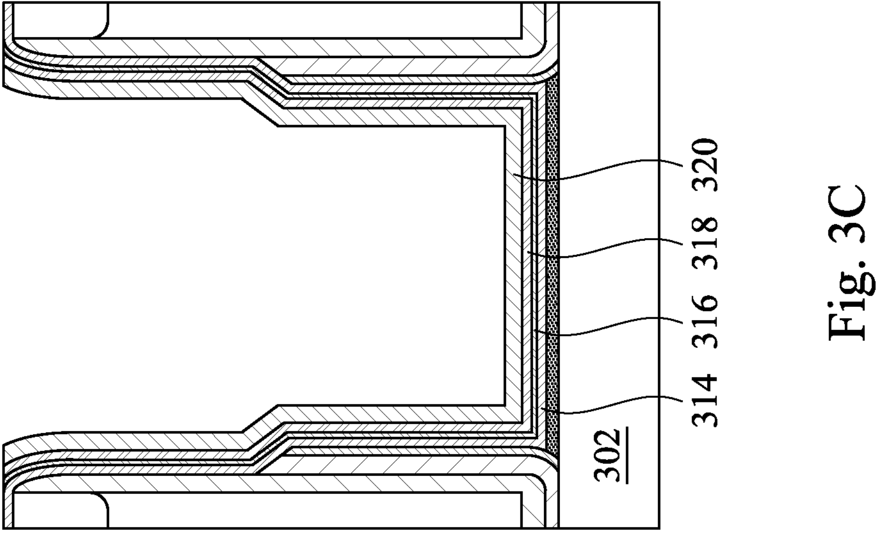
Figure 3F:
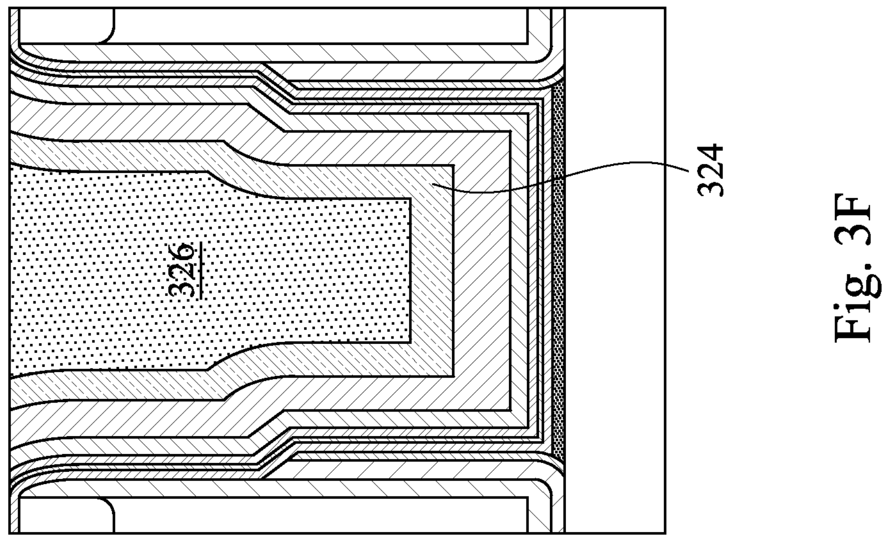
Figure 3E:
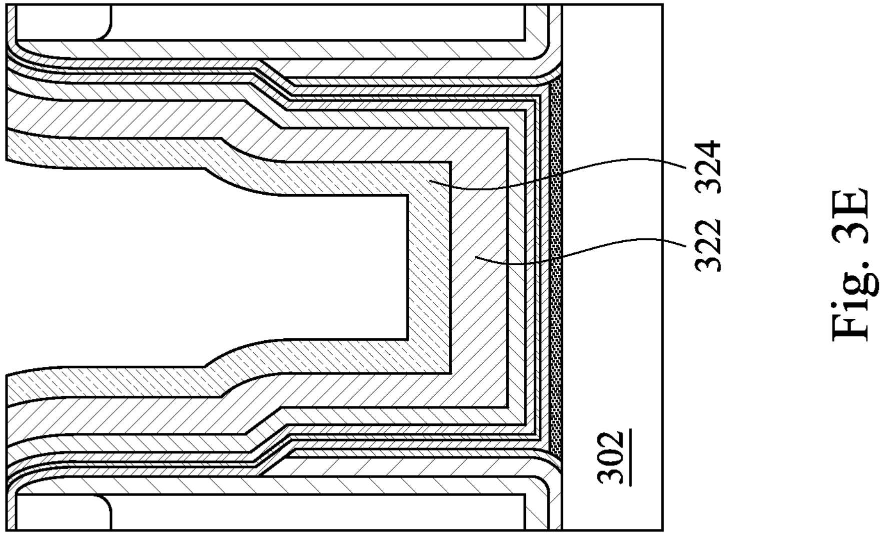

Referring to the example of FIG. 3C, in an embodiment of blocks 204 and 206, the example sub-area 301 includes a high-K material dielectric layer 314 deposited over an IL (not shown), a first work function metal layer 316 deposited over the high-K material dielectric layer 314, a second work function metal layer 318 deposited over the first work function metal layer 316, and a third work function metal layer 320 deposited over the second work function metal layer 318.

In some embodiments, the interfacial layer may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method.

High-K gate dielectrics, as used and described herein, include dielectric materials having a high dielectric constant, for example, greater than that of thermal silicon oxide (~3.9). The high-K material dielectric layer 314 may include a high-K dielectric layer such as hafnium oxide ($HfO_2$). Alternatively, the High-K gate dielectric layer may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr)$TiO_3$ (BST), $Al_2O_3$, $Si_3N_4$, oxynitrides (SiON), combinations thereof, or other suitable material. The high-K material dielectric layer 314 may be formed by ALD, physical vapor deposition (PVD), CVD, oxidation, and/or other suitable methods.

In some embodiments, the first work function metal layer 316 and the second work function metal layer 318 may comprise p-type work function metals used for tuning the threshold voltage for p-type transistors. In some embodiments, the third work function metal layer 320 may comprise an n-type work function metal used for tuning the threshold voltage for n-type transistors. The first work function metal layer 316 and the second work function metal layer 318 may include a transition metal, such as TiN, TaN, WCN, or any suitable materials or a combination thereof. The third work function metal layer 320 may include a transition metal, such as TiAlC, TaAlC, or any suitable materials or a combination thereof.

At block 208, the example process 200 includes forming a gate electrode layer. The gate electrode layer may be formed by CVD, ALD and/or other suitable processes. Referring to the example of FIG. 3D, in an embodiment of block 208, the example sub-area 301 includes a gate electrode layer 322 deposited over the third work function metal layer 320. The gate electrode layer 322 may comprise a material such as TiN or any suitable materials or a combination thereof.

At block 210, the example process 200 includes forming a first metal cap layer. The first metal cap layer may be formed by CVD, ALD and/or other suitable processes. Referring to the example of FIG. 3E, in an embodiment of block 210, the example sub-area 301 includes a first metal cap layer 324 deposited over the gate electrode layer 322. The first metal cap layer 324 may comprise a metal such as Tungsten (W) or any suitable materials or a combination thereof.

At block 212, the example process 200 includes forming a dielectric gate cap layer. The dielectric gate cap layer may be formed by CVD, ALD and/or other suitable processes. Referring to the example of FIG. 3F, in an embodiment of block 212, the example sub-area 301 includes a first dielectric gate cap layer 326 deposited over the first metal cap layer 324. The first dielectric gate cap layer 326 may comprise a material such as silicon nitride (SiN), an oxide, or any suitable materials or a combination thereof.

At block 214, the example process 200 includes selectively removing a portion of the high-K material dielectric layer, the one or more work function metal layers, the gate electrode layer, and the first metal cap layer to a level above a bottom surface of the first metal cap layer and below a top surface of a body portion of the first metal cap layer during metal gate etch back operations. The one or more work function metal layers, the gate electrode layer, and the first metal cap layer are selectively removed to cause a portion of the first metal cap layer to remain on sidewalls of the dielectric gate cap layer.

Referring to the example of FIG. 3G, in an embodiment of block 214, a portion of the high-K material dielectric layer 314, the one or more work function metal layers (e.g., first work function metal layer 316, the second work function metal layer 318, and the third work function metal layer 320), the gate electrode layer 322, and the first metal cap layer 324 have been selectively removed to a level above a bottom surface (324*a*) of the first metal cap layer 324 and below a top surface (324*b*) of a body portion of the first metal cap layer 324. The high-K material dielectric layer 314, the one or more work function metal layers, the gate electrode layer 322, and the first metal cap layer 324 have been selectively removed during metal gate etch back operations to cause sidewall portions 324*c* of the first metal cap layer 324 to remain on sidewalls of the dielectric gate cap layer. These sidewall portions 324*c* of the first metal cap layer 324 can prevent defects from forming during further processing of the semiconductor structure, such as the first dielectric gate cap layer 326 being dislodged or moving to an undesired location during further processing of the semiconductor structure.

The high-K material dielectric layer 314, the one or more work function metal layers (e.g., first work function metal layer 316, the second work function metal layer 318, and the third work function metal layer 320), the gate electrode layer 322, and the first metal cap layer 324 may be selectively removed during metal gate etch back operations via wet etch operations, dry etch operations, or a combination of both wet etch operations and dry etch operations.

In various embodiments the wet etching operations may be performed by dipping, immersing, or soaking the substrate with or in an etching solution in a wet tank. In various embodiments, during wet etch operations, the chemical etchant is a solution comprising hydrogen chloride (HCl), hydrogen dioxide ($H_2O_2$), and water ($H_2O$) with a concentration ratio range of about 1:1:360 to about 1:1:5, at a temperature of approximately 20° C. to about 70° C.

In various embodiments, the dry etching operations may be performed in a plasma dry etch chamber. In various embodiments, during dry etch operations, the etching is accomplished using a gas source comprising an etch gas, such as $BCl_3$ and/or $Cl_2$. In various embodiments, the etch gas is administered between about 0 sccm (standard cubic centimeters per minute) to about 1000 sccm. In various embodiments, the etch gas is administered with a chamber pressure from about 1.5 mTorr to about 300 mTorr, at a source power from about 300 W to about 1000 W, and at a bias power from about 0 W to about 100 W.

At block 216, the example process 200 includes forming a second metal cap layer over the high-K material dielectric layer, the one or more work function metal layers, the gate electrode layer, and the first metal cap layer. The second metal cap layer may be formed by CVD, ALD and/or other suitable processes. The second metal cap layer may be added to form a combined metal cap that stretches between the one or more spacers and across the top of the high-K material dielectric layer, the one or more work function metal layers, the gate electrode layer, and the first metal cap layer.

Figure 3H:
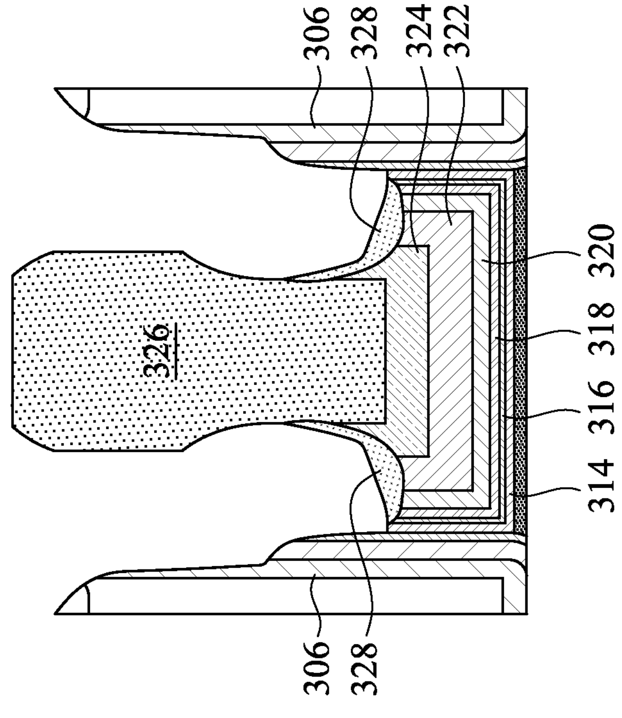
Figure 3G:
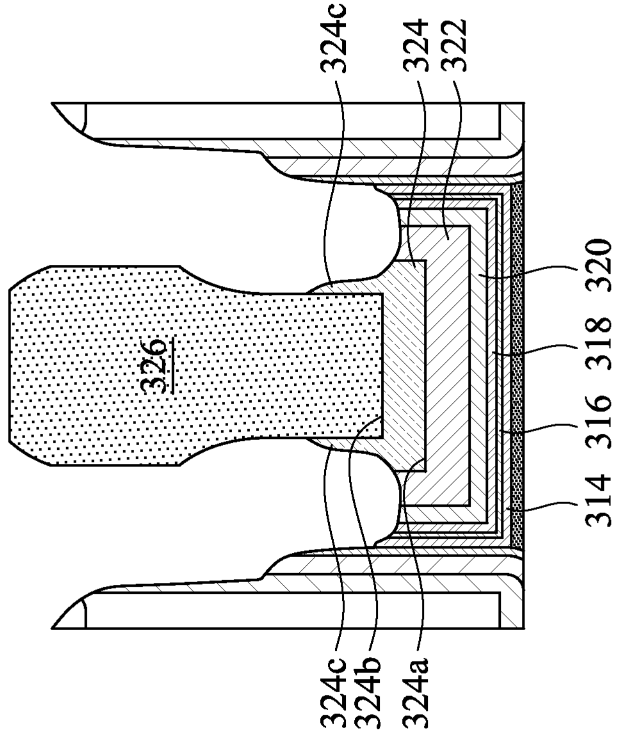

Referring to the example of FIG. 3H, in an embodiment of block 216, a second metal cap layer 328 had been formed over the high-K material dielectric layer 314, the one or more work function metal layers (e.g., first work function metal layer 316, the second work function metal layer 318, and the third work function metal layer 320), the gate electrode layer 322, and the first metal cap layer 324. The second metal cap layer 328 may comprise a metal such as Tungsten (W) or any suitable materials or a combination thereof. The second metal cap layer 328 forms a combined metal cap that stretches between the one or more spacer layers 306 and across the top of the high-K material dielectric layer 314, the one or more work function metal layers (e.g., first work function metal layer 316, the second work function metal layer 318, and the third work function metal layer 320), the gate electrode layer 322, and the first metal cap layer 324.

Figure 3J:
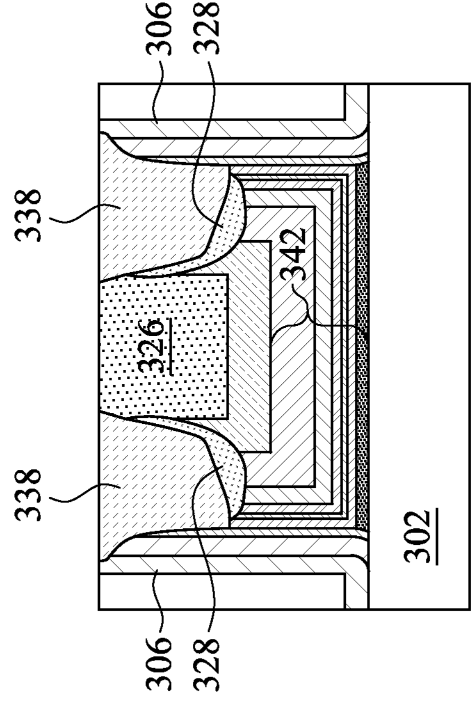
Figure 3I:
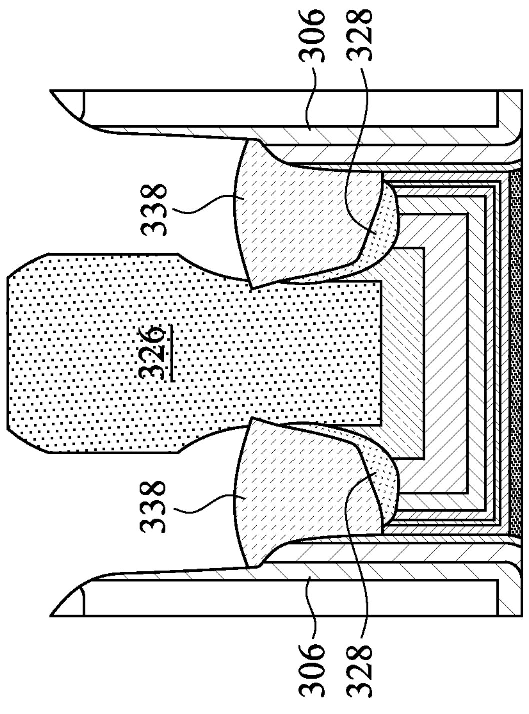
Figure 3K:
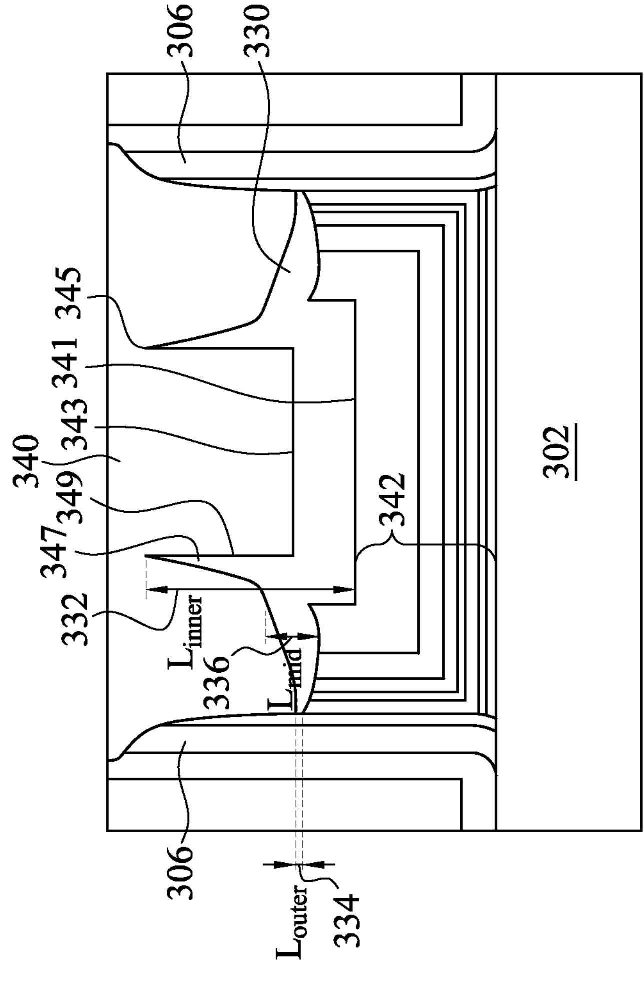

As a result of the second metal cap layer 328 formed over the first metal cap layer 324, a combined metal cap layer 330, as illustrated in FIG. 3K, is formed. In various embodiments, the combined metal cap layer 330 has a length $L_{inner}$ 332 at an inner position (e.g., sidewall portion 347 that borders an inner sidewall 349 of the combined dielectric cap layer 340), an edge length $L_{outer}$ 334, and a length $L_{mid}$ 336 at a point in between $L_{inner}$ 332 and $L_{outer}$ 334, wherein $L_{outer}$ is between about 1 nm to about 10 nm, $L_{mid}$ is between about 1 nm to about 10 nm, $L_{inner}$ is between about 2 nm to about 15 nm, $L_{inner}/L_{outer}$ is greater than 1.5, and $L_{inner}/L_{mid}$ is greater than 1.5.

At block 218, the example process 200 includes forming an additional dielectric gate cap layer over the second metal cap layer. The additional dielectric gate cap layer 338 may be deposited by CVD, ALD and/or other suitable processes. Referring to the example of FIG. 3I, additional dielectric gate cap layer 338 has been formed over the second metal cap layer 328. The additional dielectric gate cap layer 338 may comprise a material such as silicon nitride (SiN), an oxide, or any suitable materials or a combination thereof. The additional dielectric gate cap layer 338 along with the first dielectric gate cap layer 326 forms a combined dielectric gate cap (e.g., combined dielectric cap layer 340 as illustrated in FIG. 3K) that stretches between the one or more spacer layers 306 and across the top of the second metal cap layer 328.

At block 220, the example process 200 includes removing excess dielectric gate cap material. This may be performed using planarization operations such as chemical mechanical (CMP) operations. Referring to the example of FIG. 3J, in an embodiment of block 220, a sub-area 301 one stage of fabrication is depicted with a gate stack (e.g., high-K material dielectric layer 314, first work function metal layer 316, second work function metal layer 318, third work function metal layer 320, and gate electrode layer 322), a combined metal cap (e.g., first metal cap layer 324 and second metal cap layer 328), and a combined dielectric gate cap (e.g., first dielectric gate cap layer 326 and additional dielectric gate cap layer 338) disposed over an active region of a substrate 302. The dielectric gate cap and spacer layers 306 have been planarized to a desired height.

FIG. 3K provides another view of the sub-area 301 at the stage of fabrication depicted in FIG. 3J. FIG. 3K depicts a gate stack 342 (e.g., high-K material dielectric layer 314, first work function metal layer 316, second work function metal layer 318, third work function metal layer 320, and gate electrode layer 322), a combined metal cap layer 330 (e.g., first metal cap layer 324 and second metal cap layer 328), and a combined dielectric cap layer 340 (e.g., first dielectric gate cap layer 326 and additional dielectric gate cap layer 338) disposed over an active region of a substrate 302. The combined dielectric cap layer 340 and spacer layers 306 have been planarized to a desired height.

In this example, a bottom edge 341 of the combined dielectric cap layer 340 extends below portions of the combined metal cap layer 330. A bottom portion 343 of the combined dielectric cap layer 340 extends a distance below a top edge portion 345 of the combined metal cap layer 330.

At block 222, the example process 200 includes continuing semiconductor fabrication of the semiconductor device. Also, additional fabrication operations not described in process 200 can occur before, between, and after the blocks 202-220 included in process 200.

A semiconductor device may undergo further processing to form various features and regions known in the art. For example, subsequent processing may form contact openings, contact metal, as well as various contacts/vias/lines and multilayer interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Figure 4:
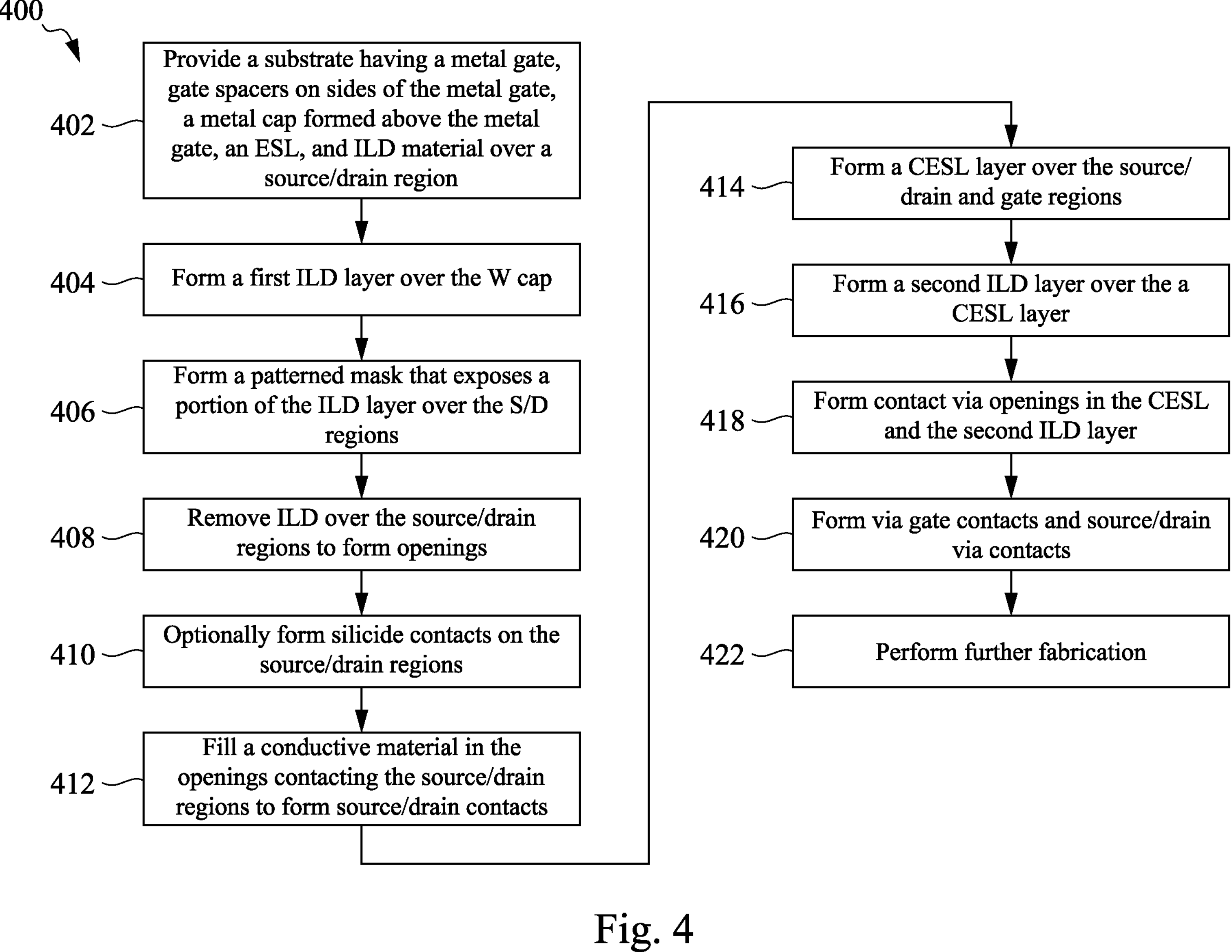
FIG. 4 is a process flow chart depicting an example method of semiconductor fabrication that includes metal drain (MD) fabrication and via gate (VG) fabrication after metal gate formation, in accordance with some embodiments, in accordance with some embodiments.

FIG. 4 is a process flow chart depicting an example method 400 of semiconductor fabrication that includes metal drain (MD) fabrication and via gate (VG) fabrication after metal gate formation, in accordance with some embodiments. The method 400 is merely an example and is not intended to limit the present disclosure beyond what is explicitly recited in the claims. Additional steps may be provided before, during, and after method 400, and some of the steps described can be moved, replaced, or eliminated for additional embodiments of method 400. Additional features may be added in the integrated circuit depicted in the figures, and some of the features described below can be replaced, modified, or eliminated in other embodiments.

FIG. 4 is described in conjunction with FIGS. 5A-5E, wherein FIGS. 5A-5E are diagrams depicting expanded views of an example area 500 at various stages of semiconductor fabricating including metal drain fabrication and via gate fabrication, in accordance with some embodiments. In some figures, some reference numbers of components or features illustrated therein may be omitted to avoid obscuring other components or features; this is for ease of depicting the figures.

At block 402, the example method 400 includes providing a substrate having a metal gate, gate spacers on sides of the metal gate, a metal cap formed above the metal gate, an etch stop layer (ESL), and interlayer dielectric (ILD) material over a source/drain region.

At block 404, the example method 400 includes forming a first ILD layer over the metal cap. The first ILD layer may include or be a material such as silicon nitride (SiN), although other suitable materials, such as silicon oxide (SiO2), aluminum oxide (AlO), silicon oxycarbide (SiOC), silicon carbon (SiC), zirconium nitride (ZrN), zirconium oxide (ZrO), combinations of these, or the like, may also be utilized. The first ILD layer may be deposited using a deposition process such as plasma enhanced atomic layer deposition (PEALD), thermal atomic layer deposition (thermal ALD), plasma enhanced chemical vapor deposition (PECVD), or others. Any suitable deposition process and process conditions may be utilized.

At block 406, the example method 400 includes forming a patterned mask that exposes a portion of the ILD material over the source/drain regions. The patterned mask may include a photo resist layer. The patterned mask may be formed by photoresist coating (e.g., spin-on coating), soft baking, mask aligning, exposure, post-exposure baking, developing the photoresist, rinsing, drying (e.g., hard baking), and/or combinations thereof. In some other embodiments, various imaging enhancement layers may be formed under photo resist layer to enhance the pattern transfer. The imaging enhancement layer may comprise a tri-layer including a bottom organic layer, a middle inorganic layer and a top organic layer. The imaging enhancement layer may also include an anti-reflective coating (ARC) material, a polymer layer, an oxide derived from TEOS (tetraethylorthosilicate), silicon oxide, or a Si-containing anti-reflective coating (ARC) material, such as a 42% Si-containing ARC layer. In yet some other embodiments, the patterned mask layer includes a hard mask layer. The hard mask layer includes an oxide material, silicon nitride, silicon oxynitride, an amorphous carbon material, silicon carbide or tetraethylorthosilicate (TEOS).

Figure 5A:
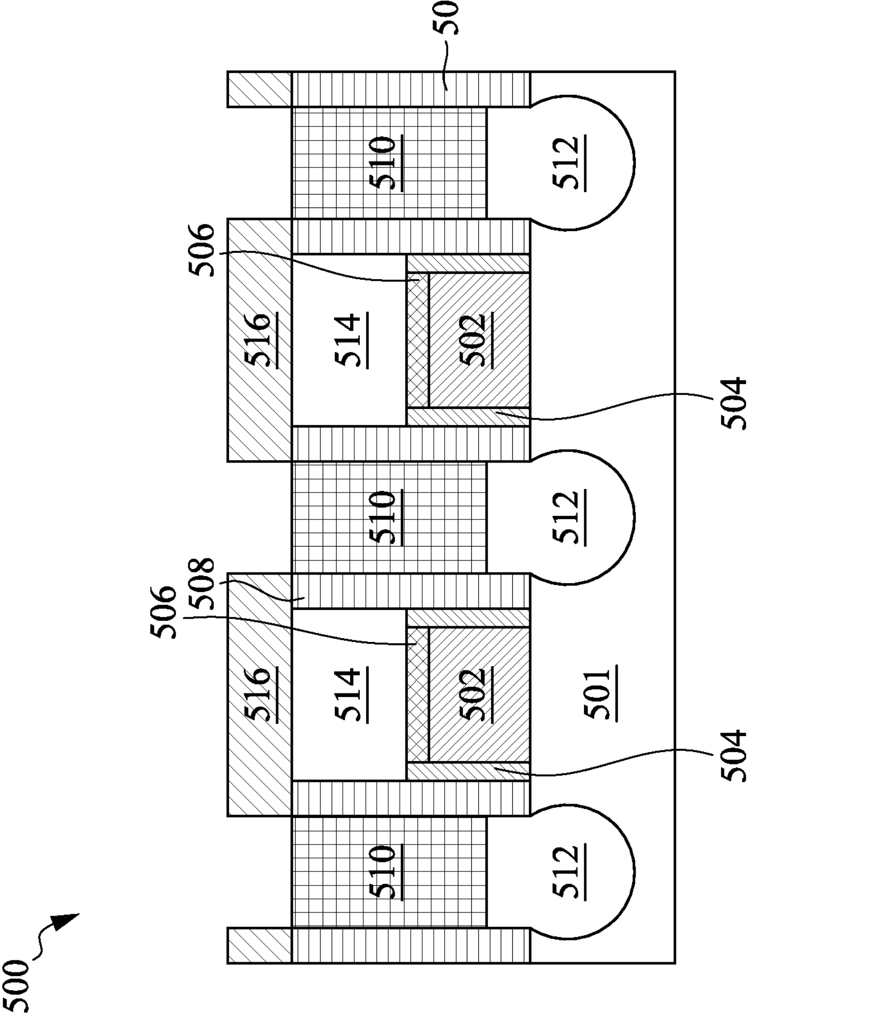
FIGS. 5A-5E are diagrams depicting expanded views of an example area at various stages of semiconductor fabricating including metal drain fabrication and via gate fabrication, in accordance with some embodiments.

Referring to the example of FIG. 5A, in an embodiment after completion of blocks 402, 404, and 406, an area 500 including a substrate 501 having a metal gate stack 502, gate spacers 504 on sides of the metal gate stack 502, a metal cap 506 formed above the metal gate stack 502, an etch stop layer (ESL) 508, ILD material 510 over a source/drain region 512, a first ILD layer 514 over the metal cap 506 and a patterned mask 516 that exposes a portion of the ILD material 510 over the source/drain regions 512 is illustrated.

At block 408, the example method 400 includes removing ILD material over the source/drain regions to form openings that expose the underlying source/drain regions. The exposed portion of the ILD material can be removed by suitable etching process, such as wet etching, dry etching, or combination thereof.

At block 410, the example method 400 includes optionally forming silicide contacts on the source/drain regions that have been exposed. The optional silicide contact may comprise titanium (e.g., titanium silicide (TiSi)) in order to reduce the Schottky barrier height of the contact. However, other metals, such as nickel, cobalt, erbium, platinum, palladium, and the like, may also be used. A silicidation may be performed by blanket deposition of an appropriate metal layer, followed by an annealing step which causes the metal to react with the underlying exposed silicon of the source/drain regions.

Figure 5B:
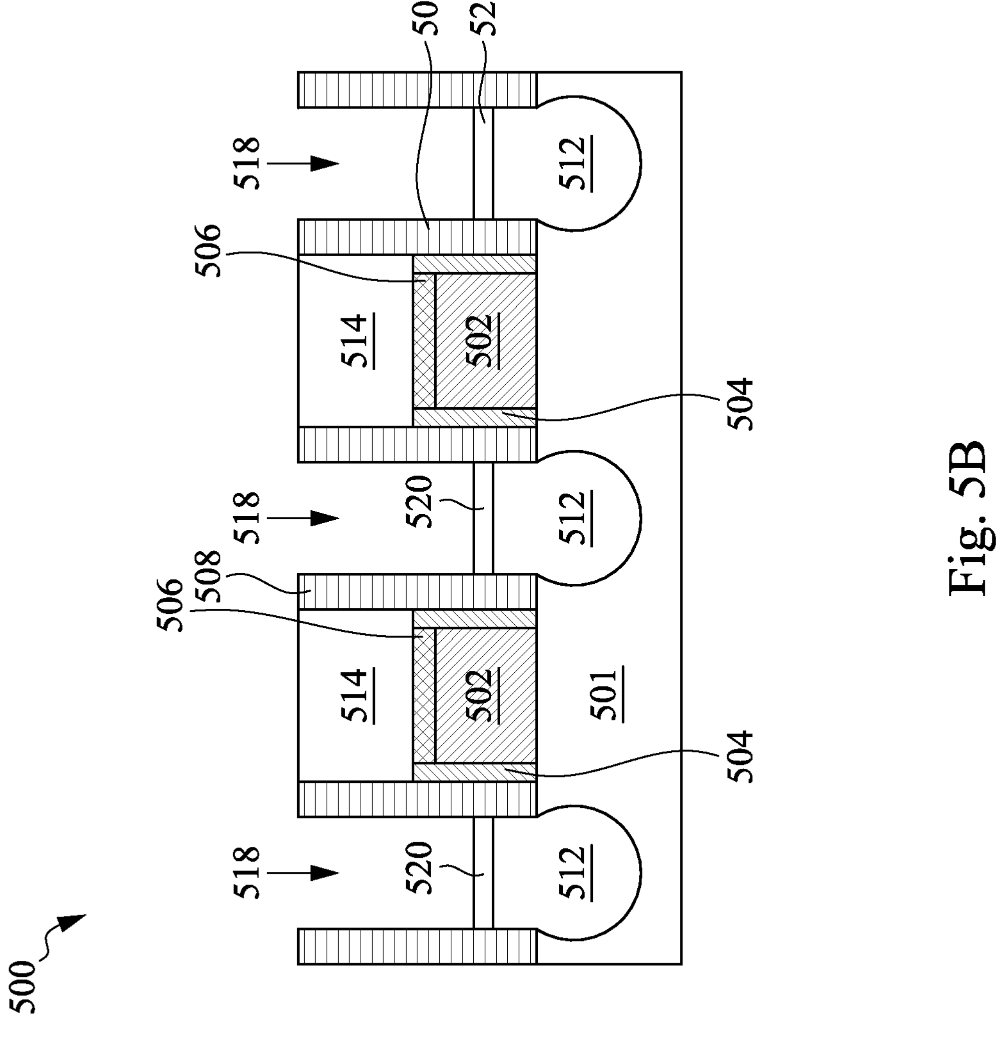

Referring to the example of FIG. 5B, in an embodiment after completion of blocks 408 and 410, the area 500 includes openings 518 that expose underlying source/drain regions 512 and optionally formed silicide contacts 520 on the source/drain regions 512 that have been exposed. The figure depicts that the ILD material 510 over the source/drain regions 512 has been removed to form the openings 518 that expose underlying source/drain regions 512.

At block 412, the example method 400 includes filling a conductive material in the openings contacting the source/drain regions to form source/drain contacts. The source/drain contact may comprise one or more layers. For example, in some embodiments, the source/drain contact comprise a liner and a metal fill material (not individually shown) deposited by, for example, CVD, ALD, electroless deposition (ELD), PVD, electroplating, or another deposition technique. The liner, such as a diffusion barrier layer, an adhesion layer, or the like, may include titanium, titanium nitride, tantalum, tantalum nitride, or the like. The conductive material may be copper, a copper alloy, silver, gold, tungsten, cobalt, aluminum, ruthenium, nickel, or the like. A planarization process, such as a CMP, may be performed to remove excess liner and conductive material. The remaining liner and conductive material form the source/drain contact in the opening.

Figure 5C:
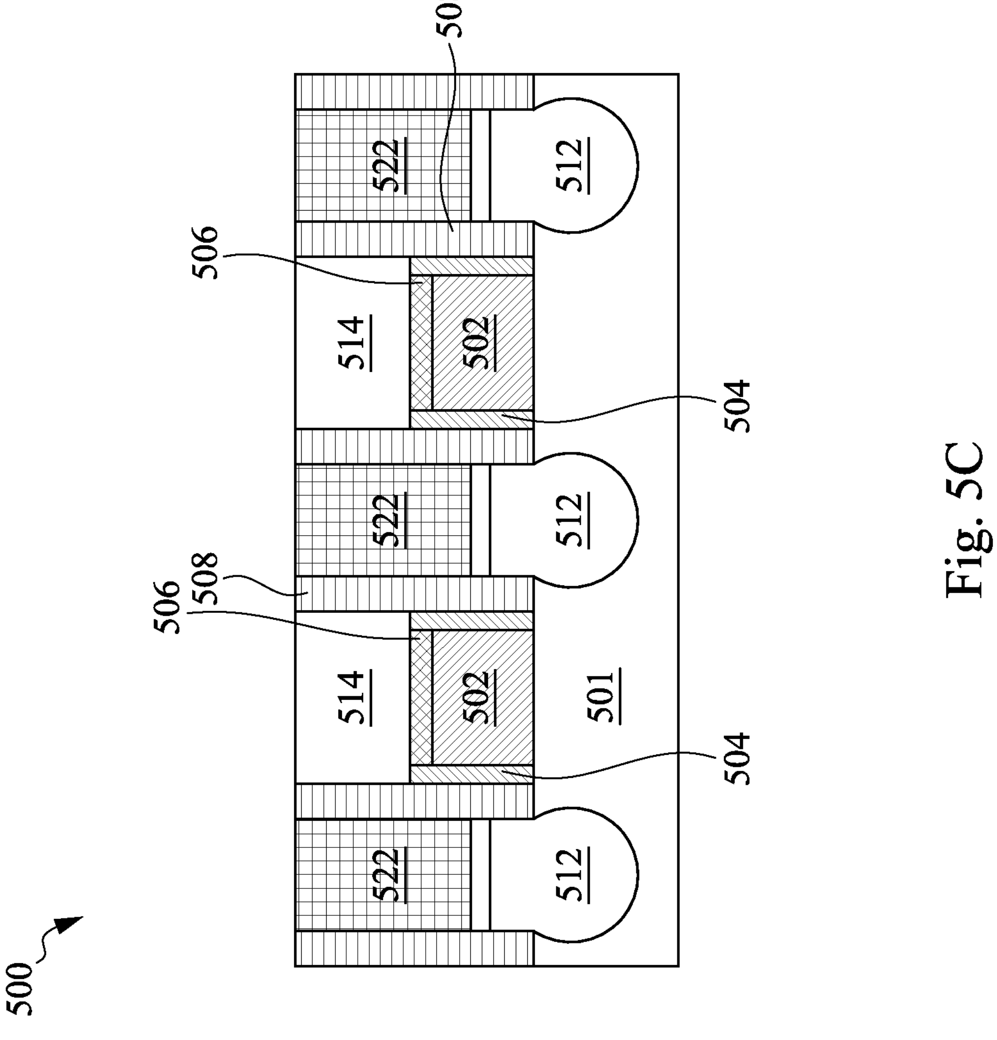

Referring to the example of FIG. 5C, in an embodiment after completion of block 412, the area 500 includes a conductive material filling the openings 518 and contacting the source/drain regions 512 to form source/drain contacts 522.

At block 414, the example method 400 includes forming a contact etch stop layer (CESL) layer over the source/drain and gate regions. The CESL may be deposited using one or more low temperature deposition processes such as chemical vapor deposition, physical vapor deposition, or atomic layer deposition.

At block 416, the example method 400 includes forming a second ILD layer over the CESL layer. The second ILD layer may be formed of a dielectric material such as oxides (e.g., silicon oxide (SiO2)) and may be deposited over the CESL by any acceptable process (e.g., CVD, PEALD, thermal ALD, PECVD, or the like). The second ILD layer may also be formed of other suitable insulation materials (e.g., PSG, BSG, BPSG, USG, or the like) deposited by any suitable method (e.g., CVD, PECVD, flowable CVD, or the like). After formation, the second ILD layer may be cured, such as by an ultraviolet curing process.

Figure 5D:
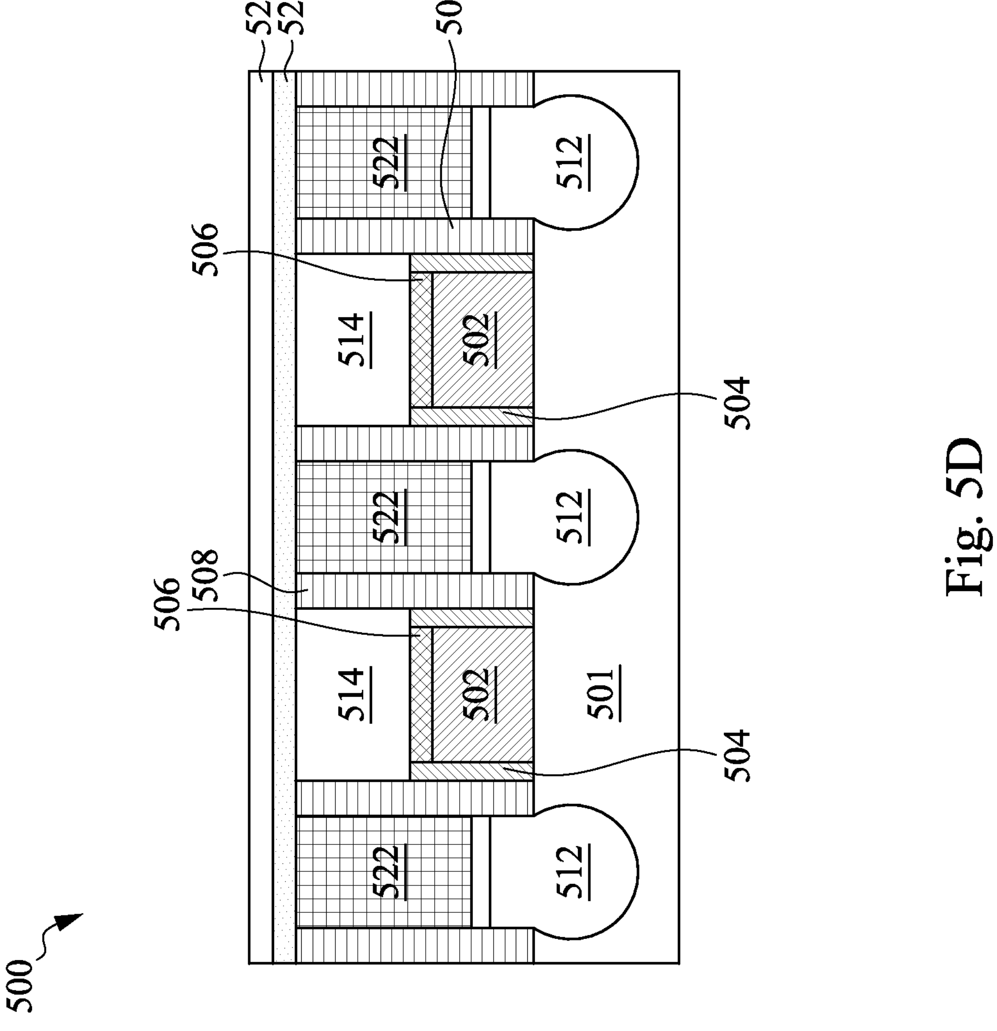

Referring to the example of FIG. 5D, in an embodiment after completion of blocks 414 and 416, the area 500 includes a CESL layer 524 formed over the source/drain and gate regions and a second ILD layer 526 formed over the CESL layer 524.

At block 418, the example method 400 includes forming contact via openings in the CESL and the second ILD layer for gate via contacts and for source/drain via contacts. Contact via openings for the gate via contact and the source/drain via contact are formed through using one or more etching processes. According to some embodiments, openings for the gate via contact are formed through the second ILD layer, the CESL, and the first ILD layer and openings for the source/drain via contact are formed through the second ILD layer and the CESL. The openings may be formed using any combination of acceptable photolithography and suitable etching techniques such as dry etching process (e.g., plasma etch, reactive ion etch (RIE), physical etching (e.g., ion beam etch (IBE))), wet etching, combinations thereof, and the like. However, any suitable etching processes may be utilized to form the contact via openings.

At block 420, the example method 400 includes forming via gate contacts and source/drain via contacts. The gate via contact is formed over and electrically coupled to the metal cap and the source/drain via contact is formed over and electrically coupled to source/drain contacts. The via gate contacts and/or the source/drain via contacts can be formed by depositing metal material in the opening. The metal material may be deposited by CVD, ALD, electroless deposition (ELD), PVD, electroplating, or another deposition technique. The via gate contacts and/or the source/drain via contacts may be or comprise tungsten, cobalt, copper, ruthenium, aluminum, gold, silver, alloys thereof, the like, or a combination thereof.

Figure 5E:
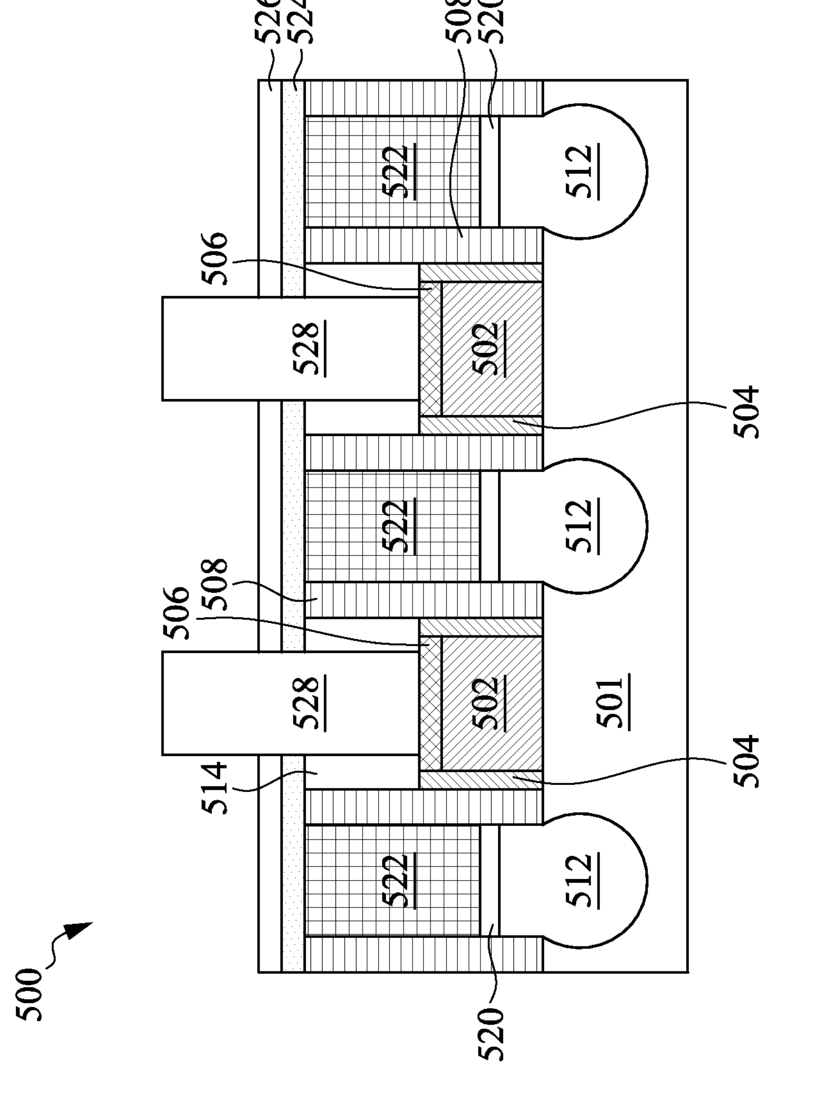

Referring to the example of FIG. 5E, in an embodiment after completion of blocks 418 and 420, the area 500 includes via gate contacts 528 and source/drain via contacts (not shown).

At block 422, the example method 400 includes performing further fabrication operations. A semiconductor device may undergo further processing to form various features and regions known in the art. For example, subsequent processing may form various contacts/vias/lines and multilayer interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 400, and some process steps described above may be replaced or eliminated in accordance with various embodiments of the method 400.

Although the foregoing examples were illustrated with respect to FinFET devices, the foregoing apparatus, devices, and methods may also be used in connection with other semiconductor transistor technologies such as gate all around (GAA) and planar transistor technologies.

In various embodiments, a semiconductor device is provided. The semiconductor device includes a gate stack over a semiconductor substrate; a metal cap over the gate stack; a dielectric cap over the metal cap; and wherein the metal cap has a sidewall portion that extends along a sidewall of the dielectric cap.

In certain embodiments of the semiconductor device, a bottom edge of the dielectric cap extends below portions of the metal cap.

In certain embodiments of the semiconductor device, a bottom portion of the dielectric cap extends a distance below a top edge portion of the metal cap.

In certain embodiments of the semiconductor device, the metal cap has a length ($L_{inner}$) at the sidewall portion that is at least 1.5 times longer than a length ($L_{outer}$) at an end portion of the metal cap that borders a gate spacer.

In certain embodiments of the semiconductor device, the length ($L_{inner}$) at the sidewall portion of the metal cap is at least 1.5 times higher than a length ($L_{mid}$) at a point between the end portion of the metal cap and the sidewall portion of the metal cap.

In certain embodiments of the semiconductor device, the metal cap includes a first metal cap section formed before metal gate etch back operations and a second portion formed after metal gate etch back operations.

In certain embodiments of the semiconductor device, the dielectric cap includes a first dielectric cap section formed before metal gate etch back operations and a second portion formed after metal gate etch back operations.

In various embodiments, a semiconductor fabrication method is disclosed. The method includes forming a gate stack in an area previously occupied by a dummy gate structure; forming a first metal cap layer over the gate stack; forming a first dielectric cap layer over the first metal cap layer; selectively removing a portion of the gate stack and the first metal cap layer while leaving a sidewall portion of the first metal cap layer that extends along a sidewall of the first dielectric cap layer; forming a second metal cap layer over the gate stack and the first metal cap layer wherein a sidewall portion of the second metal cap layer extends further along a sidewall of the first dielectric cap layer; forming a second dielectric cap layer over the second metal cap layer; and flattening a top layer of the first dielectric cap layer and the second dielectric cap layer using planarization operations.

In certain embodiments of the method, selectively removing a portion of the gate stack and the first metal cap layer includes selectively removing the gate stack and portions of the first metal cap layer to a level above a bottom surface of the first metal cap layer and below a top surface of a body portion of the first metal cap layer.

In certain embodiments of the method, selectively removing a portion of the gate stack and the first metal cap layer includes performing wet etching operations to selectively remove a portion of the gate stack and the first metal cap layer to a level above a bottom surface of the first metal cap layer and below a top surface of a body portion of the first metal cap layer.

In certain embodiments of the method, performing wet etching operations includes performing wet etching operations using a chemical etchant solution including hydrogen chloride (HCl), hydrogen dioxide ($H_2O_2$), and water ($H_2O$) with a concentration ratio range of about 1:1:360 to about 1:1:5, at a temperature of approximately 20° C. to about 70° C.

In certain embodiments of the method, selectively removing a portion of the gate stack and the first metal cap layer includes performing dry etching operations to selectively remove a portion of the gate stack and the first metal cap layer to a level above a bottom surface of the first metal cap layer and below a top surface of a body portion of the first metal cap layer.

In certain embodiments of the method, performing dry etching operations includes performing dry etching operations by administering $BCl_3$ between about 0 sccm (standard cubic centimeters per minute) to about 1000 sccm and by administering $Cl_2$ between about 0 sccm to about 1000 sccm.

In certain embodiments of the method, selectively removing a portion of the gate stack and the first metal cap layer includes performing wet etching operations and dry etching operations to selectively remove a portion of the gate stack and the first metal cap layer to a level above a bottom surface of the first metal cap layer and below a top surface of a body portion of the first metal cap layer.

In certain embodiments of the method, forming a second metal cap layer includes forming a combined metal cap layer that has a length ($L_{inner}$) at a sidewall portion of the combined metal cap layer that is at least 1.5 times longer than a length ($L_{outer}$) at an end portion of the combined metal cap layer that borders a gate spacer.

In certain embodiments of the method, forming a second metal cap layer includes forming a combined metal cap layer that has a length ($L_{inner}$) at the sidewall portion of the combined metal cap layer that is at least 1.5 times longer than a length ($L_{mid}$) at a point between the end portion of the combined metal cap layer and the sidewall portion of the combined metal cap layer.

In various embodiments, another semiconductor fabrication method is disclosed. The method includes forming a gate stack in an area previously occupied by a dummy gate structure; forming a first metal cap layer over the gate stack; forming a first dielectric cap layer over the first metal cap layer; selectively removing a portion of the gate stack and the first metal cap layer while leaving a sidewall portion of the first metal cap layer that extends along a sidewall of the first dielectric cap layer; forming a second metal cap layer over the gate stack and the first metal cap layer, the forming including forming a combined metal cap layer including the first metal cap layer and the second metal cap layer, wherein the combined metal cap layer is at a height at a sidewall portion of the combined metal cap layer that is higher than a height of the sidewall portion of the first metal cap layer, and wherein the sidewall portion of the combined metal cap layer has a length ($L_{inner}$) that is longer than a length ($L_{outer}$) at an end portion of the combined metal cap layer that borders a gate spacer; forming a second dielectric cap layer over the combined metal cap layer, the forming including forming a combined dielectric cap layer including the first dielectric cap layer and the second dielectric cap layer; and flattening a top layer of the combined dielectric cap layer using planarization operations.

In certain embodiments of the method, a bottom portion of the combined dielectric cap extends a distance below a top edge portion of the combined metal cap In certain embodiments of the method, the length ($L_{inner}$) at the sidewall portion is at least 1.5 times longer than the length ($L_{outer}$) at the end portion.

In certain embodiments of the method, the length ($L_{inner}$) at the sidewall portion is at least 1.5 times longer than a length ($L_{mid}$) at a point between the end portion and the sidewall portion.

In certain embodiments of the method, selectively removing a portion of the gate stack and the first metal cap layer includes performing wet etching operations and dry etching operations to selectively remove a portion of the gate stack and the first metal cap layer to a level above a bottom surface of the first metal cap layer and below a top surface of a body portion of the first metal cap layer.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A semiconductor device comprising:

a gate stack over a semiconductor substrate;

a metal cap over the gate stack; and a dielectric cap over the metal cap;

wherein the metal cap has a sidewall portion that extends along a sidewall of the dielectric cap; and wherein the dielectric cap has a bottom portion that is bounded on a bottom and two sidewalls by the metal cap.

2. The semiconductor device of claim 1, wherein a bottom edge of the dielectric cap extends below portions of the metal cap.

3. The semiconductor device of claim 1, wherein the metal cap has a length ($L_{inner}$) at the sidewall portion that is at least 1.5 times longer than a length ($L_{outer}$) at an end portion of the metal cap that borders a gate spacer.

4. The semiconductor device of claim 3, wherein the length ($L_{inner}$) at the sidewall portion of the metal cap is at least 1.5 times higher than a length ($L_{mid}$) at a point between the end portion of the metal cap and the sidewall portion of the metal cap.

5. The semiconductor device of claim 1, wherein the metal cap comprises a first metal cap section formed before metal gate etch back operations and a second portion formed after metal gate etch back operations.

6. The semiconductor device of claim 5, wherein the dielectric cap comprises a first dielectric cap section formed before metal gate etch back operations and a second portion formed after metal gate etch back operations.

7. A fabrication method, comprising:

forming a gate stack in an area previously occupied by a dummy gate structure;

forming a first metal cap layer over the gate stack;

forming a first dielectric cap layer over the first metal cap layer;

selectively removing a portion of the gate stack and the first metal cap layer while leaving a sidewall portion of the first metal cap layer that extends along a sidewall of the first dielectric cap layer;

forming a second metal cap layer over the gate stack and the first metal cap layer wherein a sidewall portion of the second metal cap layer extends further along a sidewall of the first dielectric cap layer;

forming a second dielectric cap layer over the second metal cap layer; and flattening a top layer of the first dielectric cap layer and the second dielectric cap layer using planarization operations.

8. The method of claim 7, wherein selectively removing a portion of the gate stack and the first metal cap layer comprises selectively removing the gate stack and portions of the first metal cap layer to a level above a bottom surface of the first metal cap layer and below a top surface of a body portion of the first metal cap layer.

9. The method of claim 7, wherein selectively removing a portion of the gate stack and the first metal cap layer comprises performing wet etching operations to selectively remove a portion of the gate stack and the first metal cap layer to a level above a bottom surface of the first metal cap layer and below a top surface of a body portion of the first metal cap layer.

10. The method of claim 9, wherein performing wet etching operations comprises performing wet etching operations using a chemical etchant solution comprising hydrogen chloride (HCl), hydrogen dioxide ($H_2O_2$), and water ($H_2O$) with a concentration ratio range of about 1:1:360 to about 1:1:5, at a temperature of approximately 20° C. to about 70° C.

11. The method of claim 7, wherein selectively removing a portion of the gate stack and the first metal cap layer comprises performing dry etching operations to selectively remove a portion of the gate stack and the first metal cap layer to a level above a bottom surface of the first metal cap layer and below a top surface of a body portion of the first metal cap layer.

12. The method of claim 11, wherein performing dry etching operations comprises performing dry etching operations by administering $BCl_3$ between about 0 sccm (standard cubic centimeters per minute) to about 1000 sccm and by administering $Cl_2$ between about 0 sccm to about 1000 sccm.

13. The method of claim 7, wherein selectively removing a portion of the gate stack and the first metal cap layer comprises performing wet etching operations and dry etching operations to selectively remove a portion of the gate stack and the first metal cap layer to a level above a bottom surface of the first metal cap layer and below a top surface of a body portion of the first metal cap layer.

14. The method of claim 7, wherein forming a second metal cap layer comprises forming a combined metal cap layer that has a length ($L_{inner}$) at a sidewall portion of the combined metal cap layer that is at least 1.5 times longer than a length ($L_{outer}$) at an end portion of the combined metal cap layer that borders a gate spacer.

15. The method of claim 14, wherein forming a second metal cap layer comprises forming a combined metal cap layer that has a length ($L_{inner}$) at the sidewall portion of the combined metal cap layer that is at least 1.5 times longer than a length ($L_{mid}$) at a point between the end portion of the combined metal cap layer and the sidewall portion of the combined metal cap layer.

16. A fabrication method, comprising:

forming a gate stack in an area previously occupied by a dummy gate structure;

forming a first metal cap layer over the gate stack;

forming a first dielectric cap layer over the first metal cap layer;

selectively removing a portion of the gate stack and the first metal cap layer while leaving a sidewall portion of the first metal cap layer that extends along a sidewall of the first dielectric cap layer;

forming a second metal cap layer over the gate stack and the first metal cap layer, the forming comprising forming a combined metal cap layer comprising the first metal cap layer and the second metal cap layer, wherein the combined metal cap layer is at a height at a sidewall portion of the combined metal cap layer that is higher than a height of the sidewall portion of the first metal cap layer, and wherein the sidewall portion of the combined metal cap layer has a length ($L_{inner}$) that is longer than a length ($L_{outer}$) at an end portion of the combined metal cap layer that borders a gate spacer;

forming a second dielectric cap layer over the combined metal cap layer, the forming comprising forming a combined dielectric cap layer comprising the first dielectric cap layer and the second dielectric cap layer; and flattening a top layer of the combined dielectric cap layer using planarization operations.

17. The method of claim 16, wherein a bottom portion of the combined dielectric cap layer extends a distance below a top edge portion of the combined metal cap layer.

18. The method of claim 17, wherein the length ($L_{inner}$) at the sidewall portion is at least 1.5 times longer than the length ($L_{outer}$) at the end portion.

19. The method of claim 18, wherein the length ($L_{inner}$) at the sidewall portion is at least 1.5 times longer than a length ($L_{mid}$) at a point between the end portion and the sidewall portion.

20. The method of claim 16, wherein selectively removing a portion of the gate stack and the first metal cap layer comprises performing wet etching operations and dry etching operations to selectively remove a portion of the gate stack and the first metal cap layer to a level above a bottom surface of the first metal cap layer and below a top surface of a body portion of the first metal cap layer.

* * * * *